United States Patent
Kaneda et al.

(10) Patent No.: US 6,294,316 B1
(45) Date of Patent: Sep. 25, 2001

(54) PROCESSES FOR MANUFACTURING FLEXIBLE PRINTED WIRING BOARDS

(75) Inventors: Yutaka Kaneda; Akira Tsutsumi; Hiroyuki Hishinuma, all of Tochigi (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/477,815

(22) Filed: Jan. 5, 2000

(30) Foreign Application Priority Data

Jan. 20, 1999 (JP) .................................................. 11-011422

(51) Int. Cl.⁷ ........................................................ G03F 7/18
(52) U.S. Cl. ........................... 430/314; 430/311; 430/323; 430/324; 430/327; 430/438; 430/613
(58) Field of Search .................................... 430/311, 314, 430/323, 324, 327; 438/613

(56) References Cited

U.S. PATENT DOCUMENTS 5,600,103 * 2/1997 Odaira .................................. 174/265
5,641,113 * 6/1997 Somaki ............................ 228/180.22
6,042,682 * 3/2000 Funaya ............................... 156/273.3
6,054,171 * 4/2000 Shoji ...................................... 437/96

FOREIGN PATENT DOCUMENTS

A-2000-12622    1/2000    (JP) .

* cited by examiner

*Primary Examiner*—Mark F. Huff
*Assistant Examiner*—Nicole Barreca
(74) *Attorney, Agent, or Firm*—Oliff & Berridge, PLC

(57) ABSTRACT

An object of the present invention is to provide a simple process for manufacturing a flexible printed wiring board having fine metal bumps.

A resin coating 21 and a resist film 24 are formed in this order on the surface of a metal film 11 and on the surface of each metal bump 16 formed on the metal film 11, and a pressure is applied on the surface to depress the resist film 24 on the metal bump 16, followed by etching. As the surface of the resin coating 21 is partially exposed at the depressed portion of the resist film 24, etching of the resin coating 21 proceeds from that portion to bulge the surface of the metal bump 16 from the resin coating 21.

14 Claims, 8 Drawing Sheets

Fig.8(a) PRIOR ART
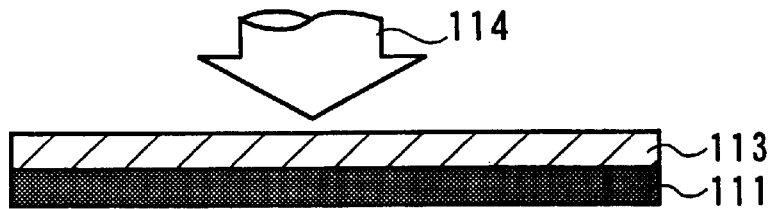
Fig.8(b) PRIOR ART
Fig.8(c) PRIOR ART
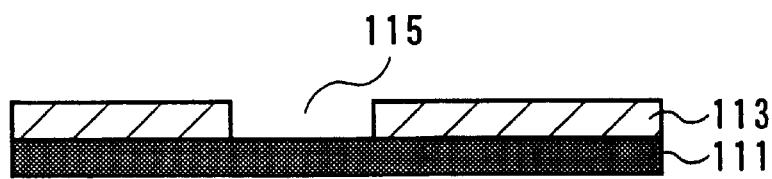
Fig.8(d) PRIOR ART
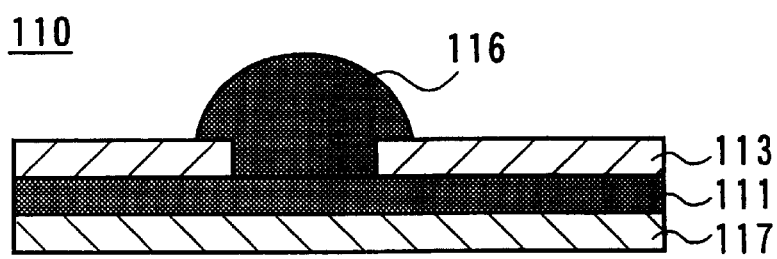

PROCESSES FOR MANUFACTURING FLEXIBLE PRINTED WIRING BOARDS

FIELD OF THE INVENTION

The present invention relates to the field of flexible printed wiring boards, particularly to a technique for simply manufacturing a flexible printed wiring board having fine metal bumps.

PRIOR ART

Recently, great importance has been attached to flexible printed wiring boards on which a chip-like semiconductor device can be mounted as a demand for smaller semiconductor devices grows.

FIG. 8(a) to (d) is a flow sheet of a process for manufacturing a flexible printed wiring board according to the prior art. In this process, a metal film of copper foil is initially applied on a polyimide film 113, then patterned to form a copper wiring. Reference 111 in FIG. 8(a) represents the copper wiring.

Then, the surface of the polyimide film 113 is irradiated with laser beam 114 (FIG. 8(b)) to form an opening 115 having a predetermined diameter (FIG. 8(c)). In this state, the surface of the copper wiring 111 is exposed at the bottom of the opening 115. Then, copper plating is performed while the back face of the copper wiring 111 is protected with a resin film 117, whereby copper grows at the portion of the copper wiring 111 exposed at the bottom of the opening 115 to form a metal bump 116 within and on the surface of the opening 115. Reference 110 in FIG. 8(d) represents a flexible printed wiring board having the metal bump portion 116.

When a semiconductor chip is to be mounted on such a flexible printed wiring board 110, the metal bump 116 and a bonding pad on the semiconductor chip are contacted and bonded together via an anisotropic conductive film. Only the bonding pad portion of the semiconductor chip is electrically connected with the flexible printed wiring board 110, because the flexible printed wiring board is insulated with the polyimide film 113 except for the metal bump 116.

Such a flexible printed wiring board 110 has recently been much used because it is thin, light and freely foldable to provide a high packaging flexibility.

However, residues of the polyimide film 113 remain on the surface of the metal wiring 111 exposed at the bottom face of the opening 115 when the opening 115 is formed with laser beam 114 as described above.

If copper plating is performed in the presence of residues, copper deposits at different speeds in a number of openings 115 to fail to form even metal bumps 116.

Thus, the prior art used to remove residues at the bottom face of each opening 115 by immersing the whole of body in a chemical solution after the opening 115 has been formed.

However, the chemical solution becomes more difficult to enter the opening 115 as it becomes finer, with the result that residues become difficult to be totally removed.

Another problem is that fine openings 115 (about 40 μm to 50 μm) having an even opening diameter can not be formed by irradiating a rigid polyimide film 111 with laser beam 114 as described above, resulting in uneven metal bumps 116 with different diameters and heights to cause failure in contact with semiconductor chips.

Still another problem is that the opening 115 having a diameter smaller than 40 μm can not be formed because it is difficult to concentrate the spot diameter of high power laser beam 114 contrary to the recent demand for the opening 115 to be finer.

An object of the present invention is to provide a technique that can form fine metal bumps with high precision in order to overcome the above disadvantages of the prior art.

SUMMARY OF THE INVENTION

In order to solve the above problems, the invention relates to a process for manufacturing a flexible printed wiring board, comprising forming a resin coating at least on a metal bump on a metal film having said metal bump, pressing said resin coating on said metal bump, and then etching said resin coating to expose the surface of said metal bump.

The present invention relates to a process for manufacturing a flexible printed wiring board, wherein said resin coating is formed on said metal bump and on said metal film.

The present invention relates to a process for manufacturing a flexible printed wiring board, wherein said resin coating comprises a lower thermosetting resin coating and an upper thermoplastic resin coating formed on the surface of said lower resin coating.

The present invention relates to a process for manufacturing a flexible printed wiring board, wherein a pressure is applied on said metal bump after a resist film resistant to etching with a chemical for etching said resin coating is formed on said resin coating.

The present invention relates to a process for manufacturing a flexible printed wiring board, wherein a pressure is applied on said metal bump after a resist film resistant to etching with a chemical for etching said upper thermoplastic resin coating is formed on said upper thermoplastic resin coating.

The present invention relates to a process for manufacturing a flexible printed wiring board, wherein said metal bump is formed by forming a photosensitive mask film on the surface of said metal film, then patterning said mask film by exposure and development, and depositing a metal by plating on the surface of said metal film exposed at the opening of said mask film.

The present invention relates to a process for manufacturing a flexible printed wiring board, wherein said pressing of said metal bump comprises at least rotating a roller against said resin coating.

The present invention relates to a process for manufacturing a flexible printed wiring board, wherein said roller is heated during said pressing.

The present invention relates to a process for manufacturing a flexible printed wiring board, wherein a polyamic acid is used as a material for said resin coating.

The present invention relates to a process for manufacturing a flexible printed wiring board, wherein a polyamic acid is used as a material for said thermosetting resin coating and/or said thermoplastic resin coating.

The present invention relates to a flexible printed wiring board comprising a metal film, a resin coating on said metal film, and a metal bump located in an opening formed in said resin coating, connected at its bottom face to said metal film and having a height greater than the thickness of said resin coating, wherein said resin coating is removed by etching at least at the portion located at an end of said metal bump to expose the end of said metal bump from the surface of said resin coating.

The present invention relates to a flexible printed wiring board wherein said metal film is patterned in a predetermined form.

The present invention relates to a flexible printed wiring board wherein an electric device is mounted on said flexible printed wiring board and a bonding pad of said electric device is connected with the end of said metal bump.

The present invention as characterized above includes a metal bump formed on a metal film. A resin coating of polyimide or the like and a resist film are formed in this order on the surface of the metal film and on the surface of the metal bump, and a pressure is applied on the surface to depress the resist film on the metal bump. In this state, the resin coating is exposed at the depressed portion of the resist film, and the resin coating exposed at the top of the metal bump can be etched by spraying an etching solution or immersing the resin coating in an etching solution with the back face being protected. During then, the resist film serves as a mask so that the resin coating is protected against etching except for the portion on the metal bump.

The resin coating may be formed as a two-layer structure having a lower rigid resin coating and an upper flexible coating so that the flexible resin coating serves as an adhesive layer with which a semiconductor chip can be adhered.

If a pressure is applied on the resin coating in a softened state without forming a resist layer, the resin coating itself is depressed to reduce the thickness on the metal bump. If the resin coating is etched in this state, the thin portion of the resin coating can be removed to expose the metal bump.

BRIEF DESCRIPTION OF THE DRAWINGS

Flexible printed wiring boards of the present invention and processes for manufacturing them will now be described with reference to the accompanying drawing in which:

FIG. 8(a) to (d) is a flow sheet showing a process for manufacturing a flexible printed wiring board according to the prior art.

Numeral references represent the following elements: 3–5: flexible printed wiring board; 11: metal film; 13: mask film; 16: metal bump; 21, 22: resin coating (21: flexible polyimide coating; 22: rigid polyimide coating); 24: resist film; $36_1$, $36_2$: roller.

DETAILED DESCRIPTION OF THE INVENTION

FIG. 1(a) to (e) and FIG. 2(f) to (k) show an example of the process for manufacturing a flexible printed wiring board according to the present invention.

Figure 1:
FIG. 1(a) to (e) is a flow sheet showing a process for manufacturing a flexible printed wiring board according to the present invention (the first half).
Figure 1:
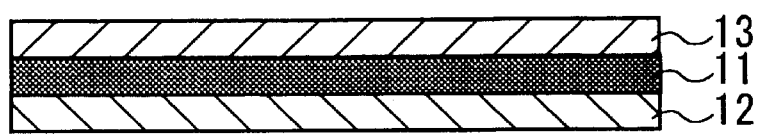
Figure 1:
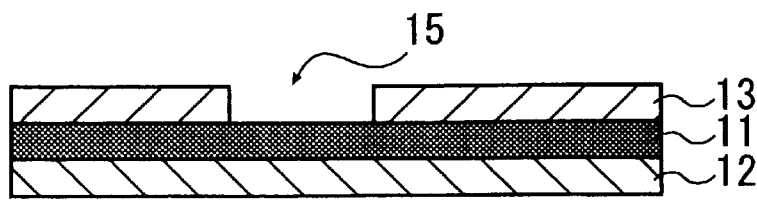
Figure 1:
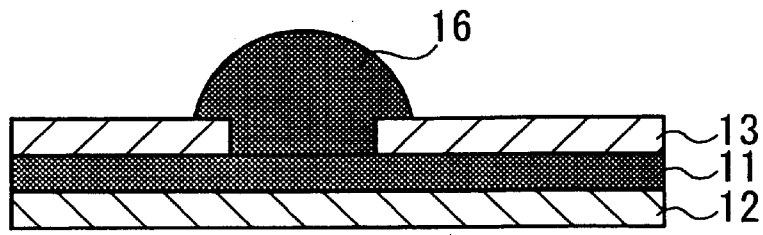
Figure 1:

Referring to FIG. 1(a), a metal film 11 of copper foil is initially prepared (a rolled copper foil having a thickness of 18 $\mu$m was used here). A protective film 12 is applied on the back face of this metal film 11 and a UV-exposable mask film 13 (dry film SPG-152 made by Asahi Chemical Industry Co., Ltd.) is applied on the surface (under application conditions of the mask film 13 at a temperature of 130° C. and a line speed of 2 m/min, for example) (FIG. 1(b)).

Then, the mask film 13 is patterned by exposure (exposure light intensity 100 mJ) through a glass mask having a given pattern and development with a chemical solution. Said patterning provides openings 15 at the locations where a plurality of metal bumps 16 described below will be formed, respectively (FIG. 1(c)).

When the glass mask has a circular pattern of 30 to 50 $\mu$m in diameter, the openings 15 can be formed approximately with an accuracy of diameter within ±2.5 $\mu$m and an accuracy of height within ±2 $\mu$m.

The present invention differs from the prior art in that laser beam is not used and that the mask film 13 is flexible enough to be patterned with a chemical solution, whereby a clean surface of the metal film 11 can be exposed without residues remaining at the bottoms of the openings 15.

When the whole of body is immersed in an electrolyte for copper plating in this state and electric current is applied, copper homogeneously grows on the surface of the metal film 11 on the bottom face of each opening 15 to fill each opening 15 with copper and then copper further grows over the surface of the mask film 13 to form metal bumps 16 having an even height (FIG. 1(d)).

Then, the mask film 13 and the protective film 12 are removed with an alkaline solution to expose the mushroom-like metal bumps 16 formed on the surface of the metal film 11. In this state, the metal bumps 16 are upright on the surface of the metal film 11. A carrier film 18 is applied on the side of the back face of the metal film 11 (FIG. 1(e)).

Figure 2:
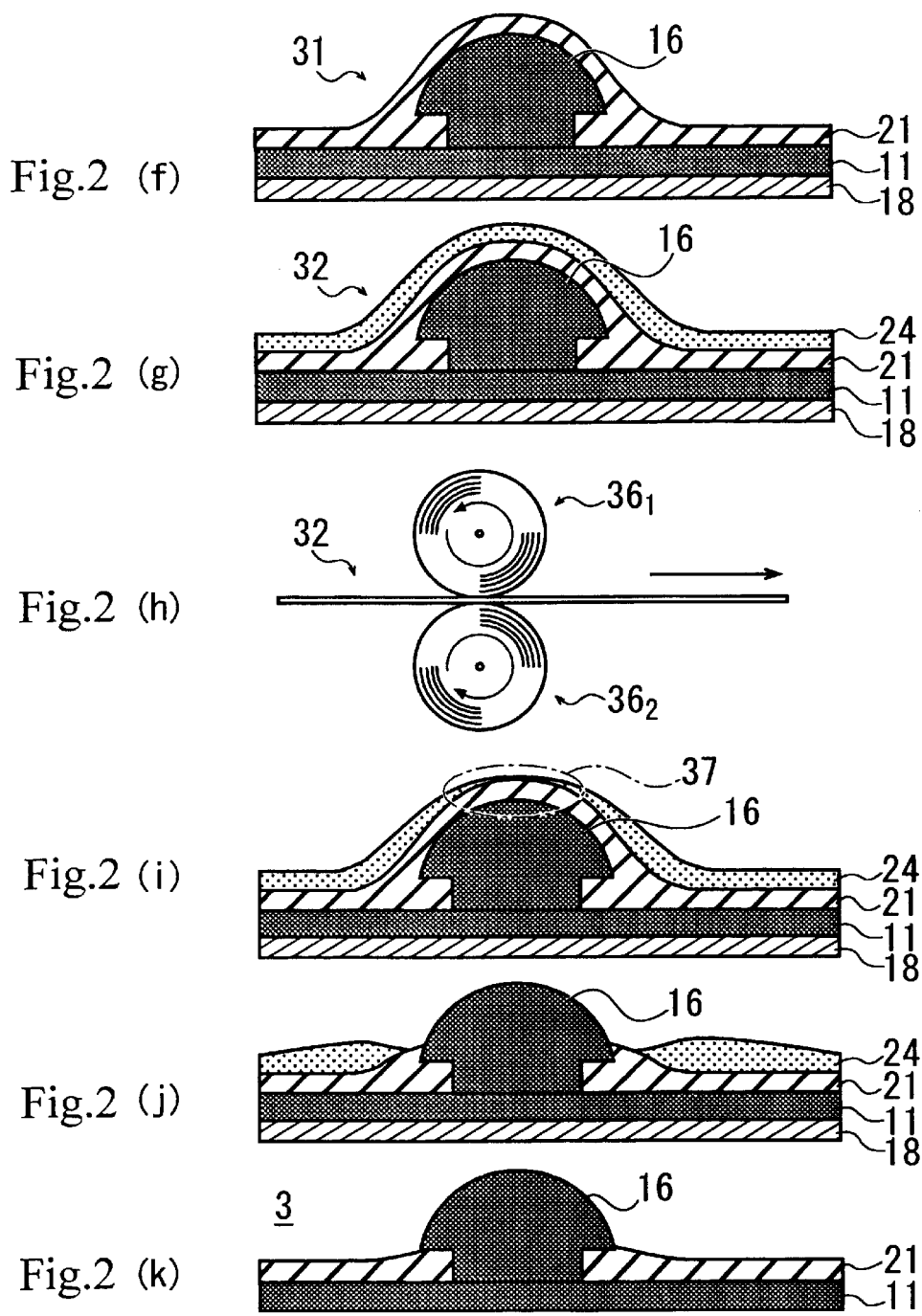
FIG. 2(f) to (k) shows the second half of the flow sheet of FIG. 1(a) to (e).

Then, referring to FIG. 2(f), a rigid resin coating 21 of a polyimide film is formed by applying and drying a polyamic acid solution on the metal bumps 16 and the face of the metal film 11 on which the metal bumps 16 are formed. During then, the polyamic acid solution is applied in such an amount that the surface of the metal film 11 and the surfaces of the metal bumps 16 are covered with the resin coating 21.

Then, a resist film 24 is formed on the surface of the resin coating 21 (FIG. 2(g)). An alkali-resistant flexible material is selected for this resist film 24 (for example, NR41A made by Sony Chemicals Corp., etc.).

The flexible board 32 in this state is passed between two rollers $36_1$, $36_2$ as shown in FIG. 2(h) to press the metal bumps 16 between the rollers $36_1$, $36_2$ at a given pressure, so that the resist film 24 at the top 37 of each metal bump 16 is depressed to reduce the thickness as shown in FIG. 2(i).

Figure 5:
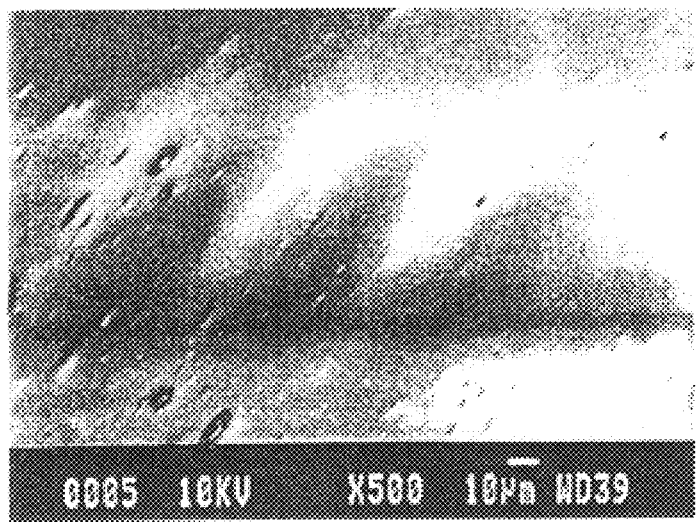
FIG. 5(a): A microphotograph showing the surface after laminating. (b): A microphotograph showing a section of a metal bump portion after laminating.
Figure 5:
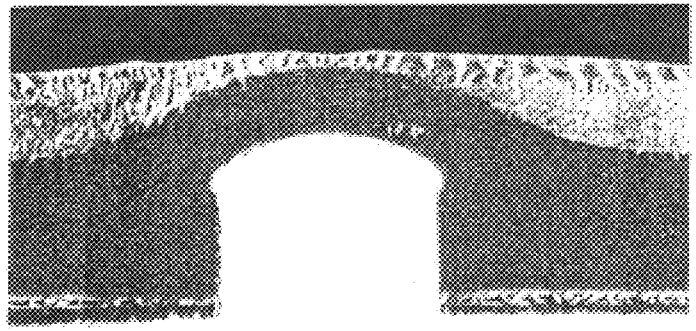

A photograph of the surface after roller pressing (laminating) is shown in FIG. 5(a), and a photograph of a section of the metal bump portion 16 after the same treatment is shown in FIG. 5(b). It is shown that the resist film 24 has a reduced thickness and the resin coating 21 is partially exposed at the top of the metal bump 16.

Then, the resist film 24 is cured by UV irradiation while the resin coating 21 is partially exposed. When an alkaline solution is sprayed and then warm water is sprayed in this order on the surface of the resist film 24, etching proceeds from the top 37 of the metal bump 16 to remove the resin coating 21 on and around the metal bump 16. For example, an alkaline solution at 40° C. is sprayed for 20 seconds and then warm water at 40° C. is sprayed for 20 seconds to etch the resin coating 21 to a depth of 10 to 15 $\mu$m.

Figure 6:
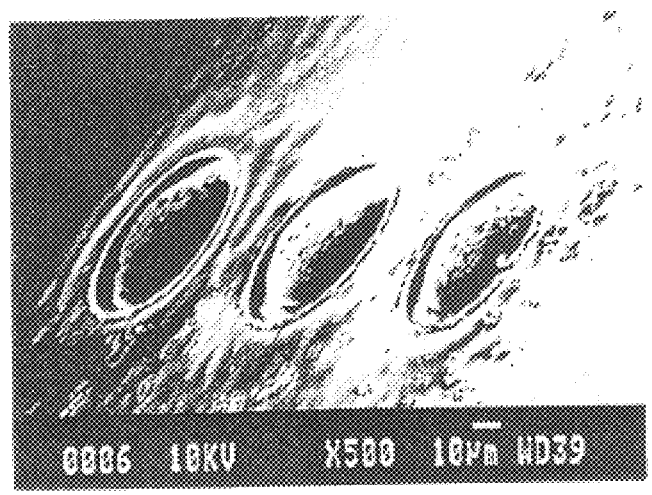
FIG. 6(a): A microphotograph showing the surface after etching. (b): A microphotograph showing a section of a metal bump portion after etching.
Figure 6:
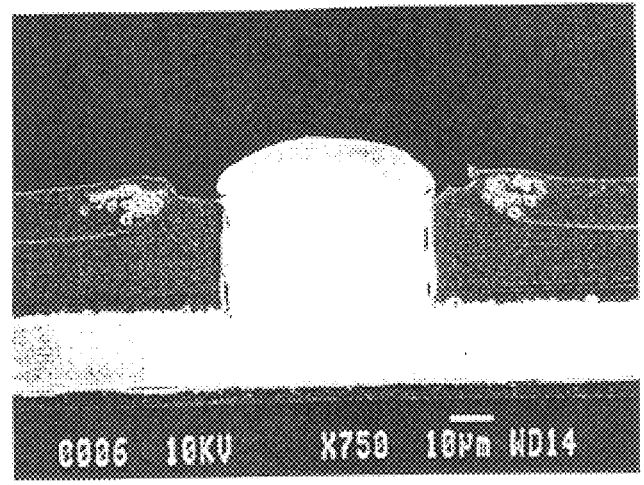

A photograph of the surface after etching is shown in FIG. 6(a), and a photograph of a section of the metal bump portion 16 after the same treatment is shown in FIG. 6(b). It is shown that the surface of the metal bump 16 appears from the top of the resin coating 21.

Finally, the remaining resist film 24 is removed and the carrier film 18 on the back face is separated, and then the resin coating 21 is cured (polyimidaization) by heat treatment (280° C. for 10 min) to give a flexible printed wiring board 3 of the present invention.

The lower resin coating 21 is thermosetting while the upper resin coating 22 is thermoplastic. This upper resin coating 22 is softened upon heating to show adhesive properties.

Figure 7:
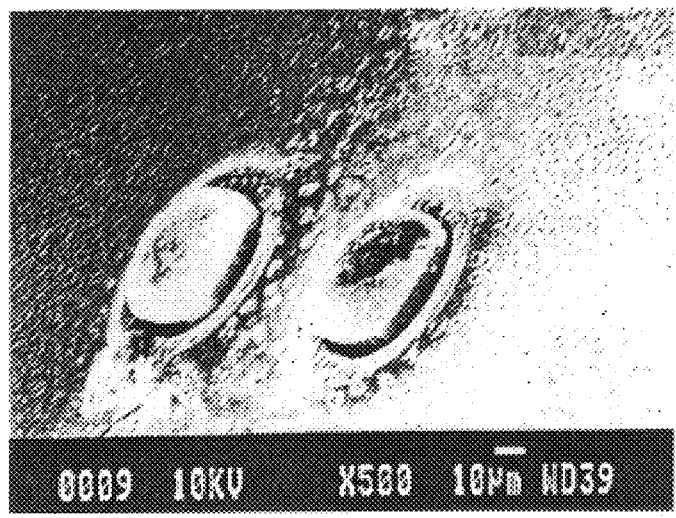
FIG. 7(a): A microphotograph showing the surface after polyimidaization. (b): A microphotograph showing a section of a metal bump portion after polyimidaization.
Figure 7:
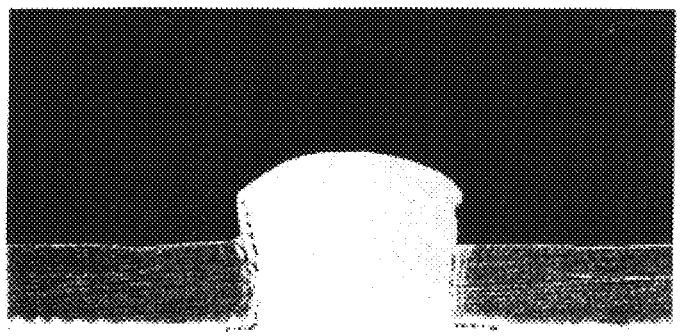

A photograph of the surface of the flexible printed wiring board 3 after polyimidaization is shown in FIG. 7(a), and a photograph of a section of the metal bump portion 16 after the same treatment is shown in FIG. 7(b). It is shown that the surface of the metal bump 16 is bulged from the top of the resin coating 21.

A metal wiring film having metal bumps can be formed by applying a photosensitive resin film on the back face of the metal film 11 of this flexible printed wiring board 3 (opposite to the face on which metal bumps 16 are formed), patterning the photosensitive resin film by exposure and development, and etching the metal film 11 as a mask.

Although a thermosetting material was used here for the lower resin coating 21 in this example, thermoplastic resin coatings may be used for both of the lower and upper resin coatings 21, 22. Alternatively, both may be thermosetting resin coatings.

When the resin coating 22 is thermoplastic, it can serve as an adhesive layer for layering another flexible printed wiring board or mounting a semiconductor chip.

Another process for manufacturing a flexible printed wiring board of the present invention will now be explained. A polyamic acid solution is applied on the thermosetting rigid resin coating 21 of the flexible board 31 shown in FIG. 2(f) to form a thermoplastic flexible resin coating 22 of a polyimide resin as shown in FIG. 3(l).

Figure 3:
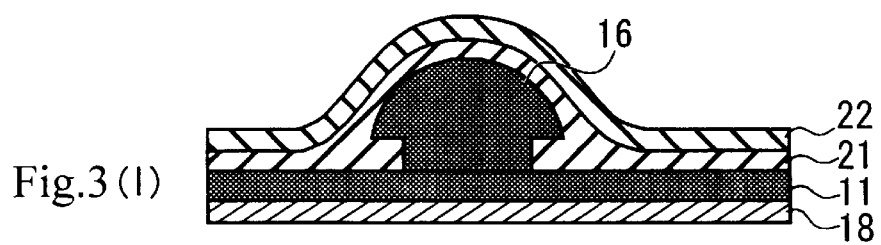
FIG. 3(l) to (o) is a flow sheet showing another process (the second half).
Figure 3:
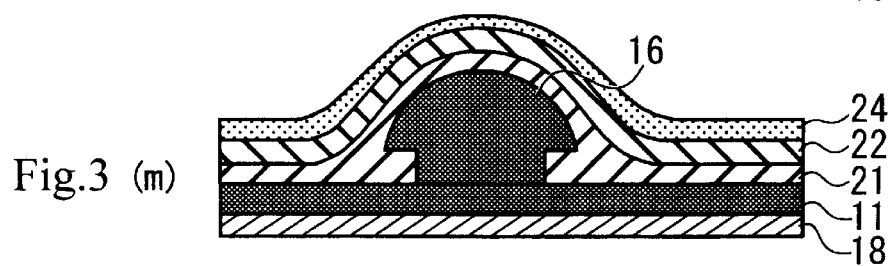
Figure 3:
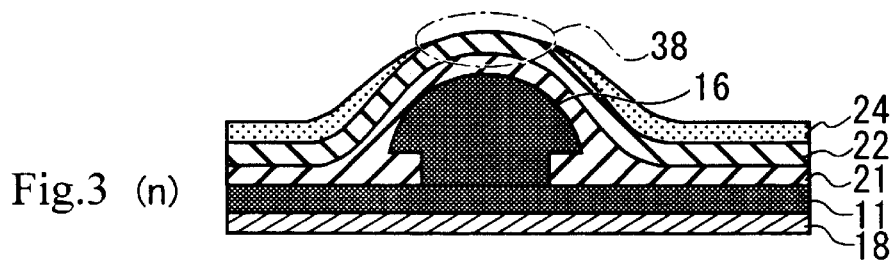
Figure 3:
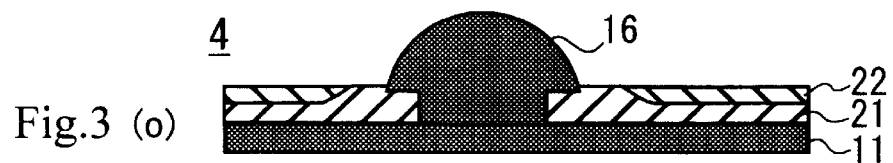

A resist film 24 is formed on the resin coating 22 (FIG. 3(m)) and the whole of body is passed between rollers to press the resin coatings 21, 22 and the resist film 24 on the metal bumps 16, so that the resist film 24 at the top 38 of each metal bump 16 is depressed as shown in FIG. 3(n). In this case, the rigid and flexible resin coatings 21, 22 are not depressed but the resist film 24 thins, with the result that the surface of the flexible resin coating 22 is partially exposed at the top 38.

When the resist film 24 is cured by UV irradiation in this state and then an alkaline solution is sprayed and then warm water is sprayed on the surface of the resist film 24, etching proceeds from the top 38 of the metal bump 16 to remove the two resin coatings 21, 22 on and around the metal bump 16 and expose the metal bump 16.

After the carrier film 18 on the back face is separated, the two resin coatings 21, 22 are cured by heat treatment into polyimide films to give a flexible printed wiring board 4 of the present invention (FIG. 3(o)).

Although the resist film 24 was used in the above examples, the resist film 24 is not always necessary for manufacturing a flexible printed wiring board of the present invention.

Figure 4:
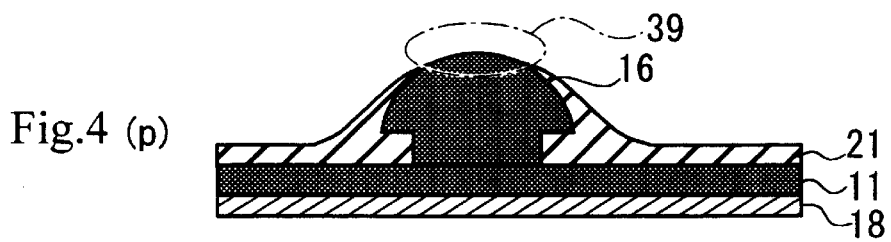
FIG. 4(p) to (r) is a flow sheet showing still another process (the second half).
Figure 4:
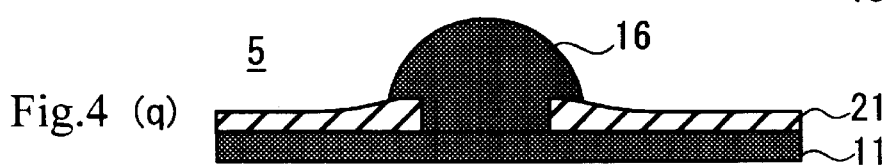

A process for the latter case involves, for example, passing the flexible board 31 shown in FIG. 2(f) between heated rollers without forming the resist film 24 to press the rigid resin coating 21, whereby the rigid resin coating 21 before cured is sufficiently softened by the heat of the rollers and the pressed rigid resin coating 21 thins at the top 39 of the metal bump 16 and the surface of the metal bump 16 is partially exposed at that portion, as shown in FIG. 4(p).

When an alkaline solution is sprayed on the surface of the resin coating 21 in this state, etching of the resin coating 21 proceeds. Said etching homogeneously proceeds on the surface of the resin coating 21 and terminates by stopping spraying the alkaline solution and washing with warm water when the top 39 of the metal bump 16 appears but before the resin coating 21 is totally etched.

The resin coating 21 is cured in this state, and finally the carrier film 18 on the back face is separated to give a flexible printed wiring board 5 of the present invention.

Figure 4R:
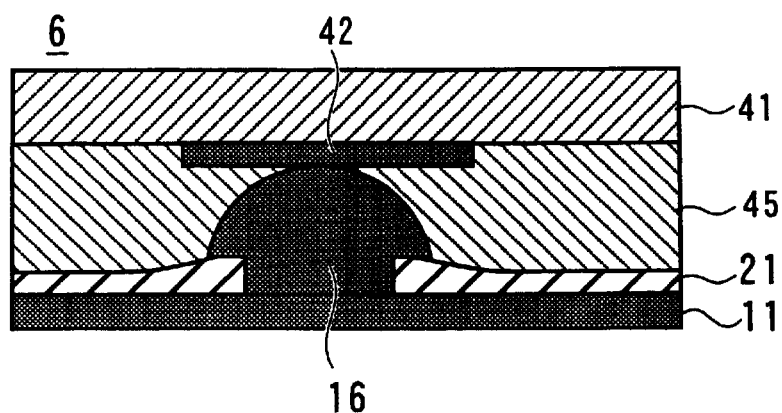

Reference 41 in FIG. 4(r) represents a chip-like electric device consisting of a semiconductor device such as a transistor or a chip-like electric device consisting of a semiconductor device such as an integrated circuit, and bonding pads 42 are formed on the surface of said electric device 41.

The electric device 41 is adhered to the flexible printed wiring board 5 with an adhesive film 45 inserted there between in such a manner that the bonding pads 42 face and come into contact with the metal bumps 16 to give a flexible printed wiring board 6 carrying the electric device 41.

The foregoing description demonstrates that the flexible printed wiring boards 3 to 5 of the present invention are inexpensive because they require no process for drilling the resin coating (polyimide film) with laser beam and the copper foil 11 on the side of metal bumps can be covered with a polyimide film.

Although copper was grown by plating to form metal bumps 16 in the above examples, other metals may also be used. The metal film 11 is not limited to copper. The resin coating of polyimide may have a monolayer structure or a two-layer structure. If it has a two-layer structure having a flexible resin coating 22 on the surface, the resin coating 22 serves as an adhesive layer for connecting a semiconductor chip to metal bumps 16. It is unnecessary to use anisotropic conductive film to connect them.

The resin coating on the copper foil 11 is not limited to a polyimide film, but may be any of various etchable resin coatings. When metal bumps 16 consist of copper, a gold coating (having a thickness of 1 to 2 $\mu$m) is preferably formed by plating or other means to improve connectability.

Although rollers $36_1$, $36_2$ were used to press the resist film 24 and rigid or flexible resin coatings 21, 22 on the metal bumps 16 in the above examples, rollers $36_1$, $36_2$ are not limitative but other means such as a flat press may also be used. Rollers $36_1$, $36_2$ may not be heated but a heating means may be provided immediately before rollers $36_1$, $36_2$ to soften the rigid resin coating 21 or the like prior to laminating.

Although the metal film 11 was patterned to form a metal wiring after it was pressed between rollers in the above examples, the present invention is not limited thereto. The metal film may be patterned with a protective film applied on the back face of the metal film before metal bumps 16 are formed, and an exposable mask film may be applied on the opposite face to the protective film and windowed by exposure and development to grow metal bumps (the latter step is the same as the above examples).

Alternatively, the metal film 11 may be patterned to form a metal wiring after metal bumps 16 have been formed but before the resin coating 21 formed on the surface of the metal bumps 16 is pressed between rollers.

Thus, the metal film of the present invention includes not only a metal foil but also a patterned metal film.

ADVANTAGES OF THE INVENTION

A flexible printed wiring board having fine metal bumps can be manufactured with a simple process at a high yield.

Metal bumps can be reliably bulged while protecting the surface of a copper foil to reduce failure in connection with semiconductor chips.

What is claimed is:

1. A process for manufacturing a flexible printed wiring board, comprising:

forming a resin coating at least on a metal bump connected to a metal film;

pressing the resin coating formed on the metal bump to reduce a thickness of the pressed portion of the resin coating; and etching the resin coating to remove the resin coating formed on the metal bump.

2. The process according to claim 1, wherein the resin coating is formed on the metal bump and on the metal film.

3. The process according to claim 1, wherein the metal bump is formed by forming a photosensitive mask film on a surface of the metal film, then patterning the mask film by exposure and development, and depositing a metal by plating on the surface of the metal film exposed at an opening of the mask film.

4. The process according to claim 1, wherein the resin coating comprises a lower thermosetting resin coating and an upper thermoplastic resin coating formed on a surface of the lower thermosetting resin coating.

5. The process according to claim 1, wherein the resin coating is formed using a polyamic acid.

6. The process according to claim 1, wherein pressing the resin coating formed on the metal bump comprises at least rotating a roller against the resin coating.

7. The process according to claim 6, wherein the roller is heated during the pressing.

8. A process for manufacturing a flexible printed wiring board, comprising:

forming a resin coating at least on a metal bump connected to a metal film;

forming a resist film resistant to etching with an etchant that etches the resin coating;

pressing the resist film formed on the metal bump to reduce a thickness of the pressed portion of the resist film to expose the resin coating;

etching the resin coating on the metal bump with the etchant to remove the resin coating on the metal bump; and removing the resist film.

9. The process according to claim 8, wherein the resin coating is formed on the metal bump and on the metal film.

10. The process according to claim 8, wherein the metal bump is formed by forming a photosensitive mask film on a surface of the metal film, then patterning the mask film by exposure and development, and depositing a metal by plating on the surface of the metal film exposed at an opening of the mask film.

11. The process according to claim 8, wherein the resin coating comprises a lower thermosetting resin coating and an upper thermoplastic resin coating formed on a surface of the lower thermosetting resin coating.

12. The process according to claim 8, wherein the resin coating is formed using a polyamic acid.

13. The process according to claim 8, wherein pressing the resist film formed on the metal bump comprises at least rotating a roller against the resist film.

14. The process according to claim 13, wherein the roller is heated during the pressing.

* * * * *